United States Patent [19]

Hara et al.

[11] Patent Number: 5,518,843
[45] Date of Patent: May 21, 1996

[54] OPTICAL FILM

[75] Inventors: Yasuo Hara, Yokohama; Hironobu Shinohara, Tokyo, both of Japan

[73] Assignee: Japan Synthetic Rubber Co., Ltd., Tokyo, Japan

[21] Appl. No.: 371,428

[22] Filed: Jan. 11, 1995

[30] Foreign Application Priority Data

Jan. 19, 1994 [JP] Japan .................................. 6-019019

[51] Int. Cl.$^6$ ....................................................... B32B 27/14
[52] U.S. Cl. ............................... 430/13; 430/11; 430/18; 428/337; 428/339; 428/500
[58] Field of Search .................................. 264/1.27, 1.29, 264/1.34, 1.33, 1.36, 1.38, 1.7; 428/337, 339, 500, 506, 523; 430/11, 13, 18, 1, 2, 5, 7

[56] References Cited

U.S. PATENT DOCUMENTS

| | | | |
|---|---|---|---|
| 4,911,966 | 3/1990 | Murayama et al. | 428/64 |
| 5,206,306 | 4/1993 | Shen | 525/332.1 |
| 5,330,880 | 7/1994 | Horigome et al. | 430/321 |
| 5,334,424 | 8/1994 | Hani et al. | 428/1 |

FOREIGN PATENT DOCUMENTS 4-077520  3/1992  Japan.

OTHER PUBLICATIONS

English Abstract of Japanese Patent 263140/1985, Dec. 26, 1985.

*Primary Examiner*—Charles L. Bowers, Jr.
*Assistant Examiner*—John A. McPherson
*Attorney, Agent, or Firm*—Oblon, Spivak, McClelland, Maier & Neustadt

[57] ABSTRACT

An optical film with a pattern formed by applying a photosensitive composition to the surface of a transparent film and by irradiating the photosensitive composition. The transparent film is made of a thermoplastic resin having a retardation of 30 nm or less, a deflection temperature under load of 100° C. or higher, a transmittance in the visible light region of 85% or higher, and a refractive index of 1.45–1.59. The optical film has optical characteristics as excellent as glass. It has superior heat resistance, more flexible, more easily processed, and lighter in weight than glass bases.

17 Claims, No Drawings

OPTICAL FILM

BACKGROUND OF THE INVENTION

1. Field of the Invention

The present invention relates to an optical film with a pattern on the surface thereof, wherein the pattern is formed by applying a photosensitive composition to the surface of a transparent film and then irradiating the composition.

2. Description of the Background Art

Glass has excellent optical characteristics such as a high transmittance in the visible light range. It is free from problems associated with retardation. In addition, glass has superior heat resistance such as a high deflection temperature under load and is less susceptible to dimensional changes due to water absorption. Because of these advantages, glass has been used widely for various optical applications. A technique of forming a pattern on the surface of a glass plate by coating its surface with a photosensitive composition and then irradiating the composition is well known in the art, and is applied to photoprocessing of optical disc stampers and the manufacture of optical discs by the 2P method.

However, because glass is easily broken and is heavy, using glass as a substrate or a base occasionally causes problems in the final product such as portable equipment. In addition, because glass is not flexible and difficult to process, there are limitations to the shape of the final products. Furthermore, because glass can be rolled up only with difficulty, its handling is restricted and the productivity of final products is poor.

Because of these reasons, films or sheets made of a transparent resin, such as polyethylene terephthalate (PET), polymethyl methacrylate (PMMA) or polycarbonate (PC), have been used instead of glass as a substrate or a base on many occasions.

For example, there is a case where a film with a pattern on its surface is used in liquid crystal display devices for the purpose of promoting light diffusion and brightness. When a PET film is used for this application, the resulting images are darker and the image quality is poorer than in the case where glass is used. This is due to the low light transmittance of PET. In the case of PMMA, the conditions under which the final products are used are restricted because of poor heat resistance and large water absorption which leads to dimensional changes in the products. PC has large retardation and its heat resistance is not necessarily sufficient. Because of these reasons, when the final products are used in automobiles, for example, deformation by heat must be taken into account. This imposes limitations on the application of PC.

Further, in the case where a film provided with a holographic pattern on its surface is used for holography, PET or PC produces errors or distortions in the resulting holographic image due to their high retardation. As a result, it is difficult to precisely reproduce the original image. PMMA also has the problem of limitations to the conditions under which the final products are used because of the poor heat resistance and the large dimensional changes due to the large water absorption. A method of providing a holographic pattern by irradiating a photosensitive composition is frequently used because of the advantage of high productivity. PET or PC has a higher refractive index than the glass used for this application. Because of this, when used together with a gelatin or acrylic photosensitive composition which is commonly used with glass bases, phenomena such as reflections occur at the interface of the film and the photosensitive composition due to the difference in the refractive indices. This may result in an impaired holographic image. PMMA imposes limitations on the method of irradiation of a photosensitive composition because of its problems in heat resistance and deflection by water absorption. That is, if the photosensitive composition is irradiated through a patterned mask, developed, and washed, the drying temperature after the development and washing is restricted, which causes the productivity to be lowered. Another problem is restriction on the use of water in the development and washing processes.

The present invention has been developed in view of this situation and has an object of providing an optical film which breaks with difficulty, is light in weight, flexible, and easily processed. Owing to these characteristics, the optical film affords an extended freedom with respect to the shape of the final product and provides high productivity. Due to the use of a base film with the same optical characteristics as glass, the optical film can be widely used for various optical applications in which glass has normally been used.

SUMMARY OF THE INVENTION

Accordingly, an object of the present invention is to provide an optical film with a pattern formed by applying a photosensitive composition to the surface of a transparent film, which demonstrates retardation of 30 nm or less, has a deflection temperature under load (hereinafter abbreviated to DTUL) of 100° C. or higher, a transmittance in the visible light region of 85% or higher, and a refractive index in the range of 1.45–1.59, and by irradiating the photosensitive composition.

Other objects, features and advantages of the invention will hereinafter become more readily apparent from the following description.

DETAILED DESCRIPTION OF THE INVENTION AND PREFERRED EMBODIMENTS

The transparent film used in the present invention has a retardation of 30 nm or less, and preferably 10 nm or less. An excellent image quality with small errors and distortions can be obtained due to the low retardation. Further, the transparent film used in the present invention has a DTUL of 100° C. or higher, and preferably 120° C. or higher. The high DTUL results in high heat resistance and ensures the excellent image quality to be maintained when used for a long period of time at high temperatures. The transmittance in the visible light region of the transparent film of the present invention is 85% or higher, and preferably 90% or higher. A distinct and excellent image quality can be ensured by the high transmittance in visible light. Furthermore, the transparent film used in the present invention has a refractive index of 1.45–1.59. By limiting the refractive index to this range the difference between the refractive index of this film and that of a gelatin or acrylic photosensitive composition used with the film can be kept small. Therefore, the undesirable phenomena such as reflections due to the difference in the refractive indices seldom occur at their interface. Thus, excellent image quality can be produced.

The transparent film used in the present invention is preferably a thermoplastic resin and, particularly, a thermoplastic resin having a norbornane structure in its recurring units.

The thermoplastic resin may be, for example, a thermoplastic resin having one of the norbornane structures represented by the following formulas (I) to (IV):

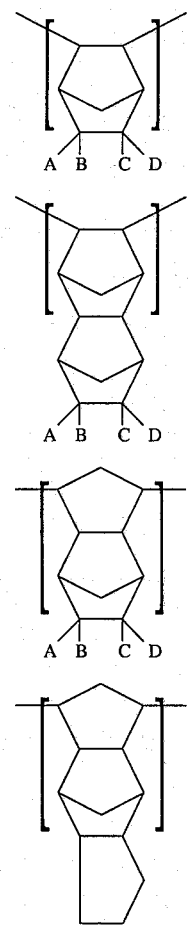

wherein A, B, C, and D may be the same or different and each represents a hydrogen atom, a hydrocarbon group having 1 to 10 carbon atoms, a halogen atom, a halogen-substituted hydrocarbon group having 1 to 10 carbon atoms, —$(CH_2)_n COOR^1$, —$(CH_2)_n OCOR^1$, —$(CH_2)_n OR^1$, —$(CH_2)_n CN$, —$(CH_2)_n CONR^2 R^3$, —$(CH_2)_n COOZ$, —$(CH_2)_n OCOZ$, —$(CH_2)_n OZ$, or —$(CH_2)_n W$, and B and C may bonded to each other to form

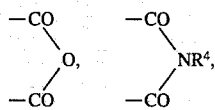

or a (poly)cycloalkylene group, in which $R^1$, $R^2$, $R^3$, and $R^4$ may be the same or different and each represents a hydrocarbon group having 1 to 20 carbon atoms; Z represents a halogen-substituted hydrocarbon group having 1 to 20 carbon atoms; W represents a group $SiR^5_p F_{3-p}$ in which $R^5$ is a hydrocarbon group having 1 to 10 carbon atoms, F is a halogen atom, —$OCOR^6$, or —$OR^6$ ($R^6$ is a hydrocarbon group having 1 to 10 carbon atoms), p represents an integer of 0 to 3, and n represents an integer of 0 to 10.

Of these norbornane structures, the structure represented by formula (III) is preferred.

The thermoplastic resins having the norbornane structure which can be used in the present invention include those described in Japanese Patent Application Laid-open (Kokai) Nos. 168708/1985, 252406/1987, 52407/1987, 145324/1988, 264626/1988, 240517/1989, and 33413/1990, Japanese Patent Application Publication (Kokoku) No. 8815/1982 and the like.

Specific examples of the thermoplastic resin include hydrogenation products of polymers obtained by subjecting at least one tetracyclododecene derivative represented by formula (V) to metathesis ring-opening polymerization:

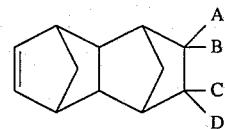

wherein A, B, C, and D are the same as defined above.

In the tetracyclododecene derivatives represented by formula (V), it is preferable, in view of the adherability of the photosensitive composition, that at least one of A, B, C, or D be a polar group. Moreover, this polar group is preferably a group represented by the formula —$(CH_2)_n COOR^1$ in which $R^1$ and n are as defined above.

In particular, the polar group represented by the formula —$(CH_2)_n COOR^1$ is preferably contained in a proportion of one group per molecule of tetracyclododecene derivative of formula (V).

Also, the smaller the integer n, the more effective the —$(CH_2)_n COOR^1$ group.

In the above formula, $R^1$ is a hydrocarbon group having 1 to 20 carbon atoms, and the number of carbon atoms is preferably as large as possible from the viewpoint that the hygroscopicity of the hydrogenated polymer obtained is reduced; however, it is preferable, in view of the balance between the hygroscopicity and the glass transition temperature of the hydrogenated polymer, that $R^1$ be a straight chain alkyl group having 1–4 carbon atoms or a (poly)cyclic alkyl group having 5 or more carbon atoms. Particularly preferable are a methyl group, ethyl group, and cyclohexyl group.

Tetracyclododecene derivatives represented by formula (V) in which a hydrocarbon group having 1–10 carbon atoms is bonded as a substituent to the carbon atom to which a group represented by —$(CH_2)_n COOR^1$ is bonded are preferred because they reduce the hygroscopicity. In particular, tetracyclododecene derivatives in which said substituent is a methyl or ethyl group are preferred because of the ease of synthesis.

One of these tetracyclododecene derivatives or a mixture thereof with an unsaturated cyclic compound copolymerizable therewith can be subjected to metathesis ring-opening polymerization and hydrogenation according to, for example, the method of Japanese Patent Application Laid-open (Kokai) No. 77520/1992, to prepare a thermoplastic resin which can be used in the present invention.

The hydrogenated polymer used as the thermoplastic resin in the present invention has preferably an inherent viscosity ($[\eta]_{inh}$) of 0.3 to 1.5 dl/g measured at 30° C. in chloroform.

The thermoplastic resin having a norbornane structure used in the present invention has preferably a weight-average molecular weight of 5,000–1,000,000, and more preferably 8,000–200,000, for imparting sufficient strength.

The resin having the inherent viscosity or the weight-average molecular weight of the above ranges exhibits excellent film molding processability, heat resistance, and mechanical characteristics.

The degree of hydrogenation of the polymer is 50% or higher, preferably 90% or higher, and more preferably 98% or higher, as determined by $^1$H-NMR at 60 MHz. The higher the degree of hydrogenation, the better the stability of the optical film against heat and light.

Incidentally, the gel content of the present thermoplastic resin used as the material of the transparent film is 5% by weight or less, and more preferably 1% by weight or less.

Additives such as stabilizers, antioxidants, lubricants, inorganic fillers, antistatic agents, UV absorbers, fluorescent whiteners, plasticizers, and the like may be added to the thermoplastic resin having a norbornane structure used in the present invention.

Although there are no specific limitations to the thickness of the transparent film used as the base material for the optical film of the present invention, a thickness of 0.005–2 mm, and preferably 0.01–0.5 mm, is appropriate. If the thickness is less than 0.005 mm, the film strength is insufficient; if more than 2 mm, the roll-up operation of the film is difficult. The film can be manufactured by the melt extrusion method, the solution casting method, or the like. For controlling the adherability of the photosensitive composition, the surface of this transparent film may be subjected to a pretreatment before it is coated with the photosensitive composition. This pretreatment may be a physical treatment such as plasma treatment or a chemical treatment using various coating agents, such as conventional rubber coating agents and resin coating agents, especially an acrylic coating agent or a silicone coating agent.

Specific examples of the photosensitive compositions used for forming a pattern on the optical film of the present invention include a composition comprising at least one compound having at least one ethyleneic double bond (e.g. (meth)acryloyl group) in the molecule and a photopolymerization initiator; a composition comprising at least one compound having at least one ring-opening reactive group (e.g. epoxy group) in the molecule and a photocationic reaction initiator; a composition comprising a gelatin and a bichromate; a composition comprising a cyclic rubber and a bisazide photosensitizer; and a composition comprising a novolak resin and a quinone azide photosensitizer.

The following methods are examples of the method for producing a desired pattern on the surface of the transparent film by irradiating the photosensitive composition.

(1) A method of irradiating a photosensitive composition coated on the transparent film through a mask which is provided with a pattern in advance, and then developing.

(2) A method comprising pressing a stamper which is provided with a pattern in advance on the photosensitive composition coated on the transparent film and then irradiating the photosensitive composition through the transparent film to cure it.

(3) A method of directly irradiating the photosensitive composition coated on the transparent film with a laser beam, and then developing.

The coating thickness of the photosensitive composition is determined according to the application of the optical film, with no specific limitation. Usually, a thickness of 0.5–200 µm is appropriate. The precision of patterns is also determined according to the application of the optical film, with no specific limitation. Generally, resolution in the range of 0.5–10 µm is required.

Applications of the optical film of the present invention include, for example, light diffusion films for liquid crystal display panels, color filters, Fresnel's lenses, lenticules, films for holography, and the like.

Japanese Patent Application No. 19019/1994 filed on Jan. 19, 1994 is herein incorporated as reference.

Other features of the invention will become apparent in the course of the following description of the exemplary embodiments which are given for illustration of the invention and are not intended to be limiting thereof. In the Examples hereinafter, "%" means "% by weight" and "parts" means "parts by weight", unless otherwise indicated.

EXAMPLES

REFERENCE EXAMPLE 1

To an autoclave with an internal volume of 1 l were charged 100 g of 8-methyl-8-methoxycarbonyltetracyclo[4.4.0.$1^{2,5}$.$1^{7,10}$]dodeca-3-ene, 60 g of 1,2-dimethoxyethane, 240 g of cyclohexane, 25 g of 1-hexene, and 3.4 ml of a 0.96 mol/l diethylaluminum chloride solution in toluene.

20 ml of a 0.05 mol/l tungsten hexachloride solution in 1,2-dimethoxyethane and 10 ml of a 0.1 mol/l paraaldehyde solution in 1,2-dimethoxyethane were mixed in a flask, and 4.9 ml of this mixed solution was added to the mixture in the autoclave. The autoclave was tightly capped and heated at 80° C. for 3 hours with stirring.

A mixed solvent consisting of 1,2-dimethoxyethane and cyclohexane (2:8 by weight) was added to the polymer obtained so as to obtain a 1:10 (by weight) mixture of the polymer and the solvent. 20 g of triethanolamine was added to the mixture, followed by stirring for 10 minutes.

500 g of methanol was added to the polymer solution and the resulting mixture was stirred for 30 minutes, and then allowed to stand. After discarding the upper layer of the two layers produced, methanol was again added to the residue and the mixture was stirred and allowed to stand, and the resulting upper layer was discarded. This procedure was further repeated two times, and the lower layer obtained was diluted with cyclohexane and 1,2-dimethoxyethane so as to obtain a 10% polymer solution in cyclohexane/1,2-dimethoxyethane.

20 g of palladium/silica magnesia (palladium content: 5%, manufactured by Nikki Chemical Co., Ltd.) was added to this polymer solution and the resulting mixture was reacted by an autoclave under a hydrogen pressure of 40 kg/cm$^2$ at 165° C. for 4 hours. The hydrogenation catalyst was removed by filtration to obtain a hydrogenated polymer solution.

Pentaerythrityl-tetrakis[3-(3,5-di-tert-butyl-4-hydroxyphenyl)propionate] was added to the hydrogenated polymer as an antioxidant in a proportion of 0.1% by weight, followed by evaporation of the solvent under reduced pressure at 380° C.

The molten resin was pelletized by an extruder under a nitrogen atmosphere to produce a thermoplastic resin (Resin A) having an inherent viscosity of 0.5 dl/g (30° C., in chloroform), a degree of hydrogenation of 99.5% and a glass transition temperature of 168° C.

Resin A was then dissolved in methylene chloride and filtered to remove particles and the like of a size larger than 0.1 µm, thus obtaining a 30% (by weight) solution of Resin A. Subsequently, this solution was cast in a layer of an even thickness through a die and dried at 120° C., to obtain a Film A with a thickness of 100 µm.

REFERENCE EXAMPLE 2

6-Ethylidene-2-tetracyclododecene was subjected to metathesis ring-opening polymerization, hydrogenation and pelletization in the same manner as in Reference Example 1 to obtain a thermoplastic resin (Resin B) having an inherent viscosity of 0.56 dl/g (30° C., in chloroform), a degree of hydrogenation of 99%, and a glass transition temperature of 140° C.

Then, a Film B with a thickness of 100 µm was obtained in the same manner as in Reference Example 1.

REFERENCE EXAMPLE 3

55 mol % ethylene and 45 mol % of 2-methyl-1,4,5,8-dimethano- 1,2,3,4,4a,5,8,8a-octahydronaphthalene were subjected to addition polymerization, and the resulting polymer was pelletized to obtain a thermoplastic resin (Resin C) having an inherent viscosity of 0.64 dl/g (35° C., in decalin) and a glass transition temperature of 140° C.

Then, a Film C with a thickness of 100 μm was obtained in the same manner as in Reference Example 1.

The properties of the Films A, B and C, thus obtained, and the properties of the PET film and the PC film which are used in Comparative Examples are shown in Table 1.

TABLE 1

|  | A | B | C | PET | PC |
| --- | --- | --- | --- | --- | --- |
| Refractive index | 1.51 | 1.53 | 1.55 | 1.66 | 1.59 |
| Retardation (nm) | 2 | 5 | 8 | 110 | 48 |
| Transmittance (%) | 95 | 95 | 95 | 85 | 90 |
| Glass transition temperature (°C.) | 170 | 145 | 151 | 70 | 140 |
| DTUL (°C.) | 164 | 125 | 133 | — | 120 |

Measuring Method

Refractive index: ASTM D542

Retardation: Ellipsometer

Transmittance: ASTM D1003

Glass transition temperature: DSC

Deflection temperature under load (DTUL): ASTM D648 (load: 18.6 kg/cm$^2$, samples were prepared by injection molding)

EXAMPLE 1

A photosensitive (UV curable) resin composition shown below was applied to the surface of the Film A using an applicator bar with a clearance of 50 μm. Subsequently, a stamper, which has a fine irregular pattern produced in advance, was pressed onto the UV curable resin composition and UV light at 1J/cm$^2$ was irradiated from the uncoated side of the film to cure the resin composition. After curing, the stamper was peeled off to obtain a transparent film A-1 with a fine irregular pattern on the surface.

| <Photosensitive composition> | |
| --- | --- |
| Epoxy acrylate (Epoxyester 3002A, trademark, Kyoeisha Chemical Co., Ltd.) | 60 g |
| Trimethylolpropane triacrylate Aronix M-309, trademark, Toagosei Chemical Industry Co., Ltd.) | 25 g |
| Acrylic acid | 15 g |
| Photoinitiator (Irgacure 184, trademark, Ciba Geigy) | 4 g |

The transmittance and the brightness on the face (conforming to JIS C7641, provided that the light receptor was placed in front of the film. A cold cathode ray tube, CXA-1301 (trademark, TDK Co., Ltd.), was used as the light source) were measured. Further, the transparent film A-1 was heated in an air-oven at 120° C. for 24 hours and the deflection in the shape of the surface was observed by an optical microscope of 200 magnification.

The results are shown in Table 2.

EXAMPLE 2

A transparent film B-1 with a fine irregular pattern on the surface was prepared in the same manner as in Example 1. The evaluation of the transparent film B-1 was made in the same manner as in Example 1. The results are shown in Table 2.

EXAMPLE 3

A transparent film C-1 with a fine irregular pattern on the surface was prepared in the same manner as in Example 1. The evaluation of the transparent film C-1 was made in the same manner as in Example 1. The results are shown in Table 2.

COMPARATIVE EXAMPLE 1

The same UV curable resin composition as used in Example 1 was coated onto a quartz glass plate with a thickness of 1 mm to which a silane coupling agent was applied in advance. The resin composition was cured in the same manner as in Example 1 to obtain a glass plate with a fine irregular pattern on the surface.

The evaluation of the quartz glass plate thus obtained was made in the same manner as in Example 1. The results are shown in Table 2.

COMPARATIVE EXAMPLE 2

The same UV curable resin composition as used in Example 1 was applied to a transparent PET film (manufactured by Toray Industries, Inc.) with a thickness of 100 μm. The resin composition was cured in the same manner as in Example 1 to obtain a transparent film with a fine irregular pattern on the surface.

The evaluation of the film thus obtained was made in the same manner as in Example 1. The results are shown in Table 2.

TABLE 2

|  | Transmittance (%) | Brightness on the face (cd/m$^2$) | Deflection under heat |
| --- | --- | --- | --- |
| Example 1 | 90.2 | 150 | No deflection |
| Example 2 | 89.5 | 131 | No deflection |
| Example 3 | 89.2 | 144 | No deflection |
| Comparative Example 1 | 91.0 | 148 | No deflection |
| Comparative Example 2 | 80.4 | 112 | Large deflection |

EXAMPLE 4

A styrene/butadiene copolymer latex (JSR #0573, trademark, Japan Synthetic Rubber Co., Ltd.) was coated onto the transparent film A and dried at 120° C. Then, a gelatin composition shown below was applied to this film by spin coating to obtain a dry thickness of 1 μm.

| <Gelatin composition> | |
| --- | --- |
| Gelatin (Nitta Gelatin Inc.) | 20 g |
| Ammonium bichromate (Wako Pure Chemical Industries, Ltd.) | 2 g |
| Clean water | 80 g |

After coating the gelatin composition, the film was dried at 120° C., irradiated through a mask with a holographic pattern, developed, washed, and dried at 120° C. to obtain a transparent film A-2 having a holographic pattern on its surface.

A holographic image was obtained by irradiating light to the untreated (smooth) surface of the transparent film A-2. The original image was precisely reproduced with no error or distortion.

COMPARATIVE EXAMPLE 3

A glass plate with a holographic pattern on the surface was obtained in the same manner as in Example 4 using a quartz plate with a thickness of 1 mm.

A holographic image obtained using this glass plate precisely reproduced the original image with no error or distortion.

COMPARATIVE EXAMPLE 4

A transparent film with a holographic pattern on the surface was obtained in the same manner as in Example 4 using a transparent PC film (manufactured by Teijin Ltd.) with a thickness of 100 μm.

Errors and distortions which are considered to be caused by high retardation of the PC were observed in the holographic image obtained using this transparent film.

As illustrated above, the optical film of the present invention has the same excellent characteristics as glass plate. Owing to the excellent optical characteristics and superior heat resistance, the optical film of the present invention has less limitations imposed thereto as compared with conventional optical films. Further, because the optical film of the present invention is more flexible, more easily processed, and lighter in weight than glass, it can be widely used for portable apparatus, equipment and the like.

Obviously, numerous modifications and variations of the present invention are possible in light of the above teachings. It is therefore to be understood that within the scope of the appended claims, the invention may be practiced otherwise than as specifically described herein.

What is claimed is:

1. An optical film with a pattern formed by applying a photosensitive composition to a surface of a transparent film of a thermoplastic resin having a norbornane structure, wherein said transparent film demonstrates retardation of 30 nm or less, has a deflection temperature under load of 100° C. or higher, a transmittance in a visible light region of 80% or higher, and a refractive index in a range of 1.45–1.59, and by irradiating the photosensitive composition.

2. The optical film according to claim 1, wherein said norbornane structure is a structure represented by the following formulas (I), (II), (III), or (IV),

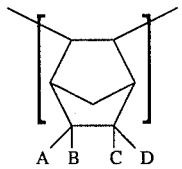
(I)

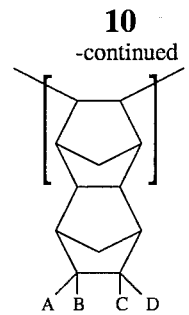
(II)

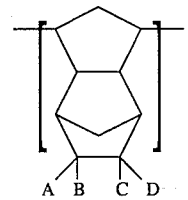
(III)

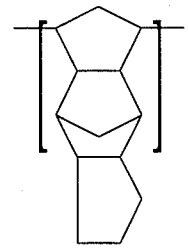
(IV)

wherein A, B, C, and D may be the same or different and each represents a hydrogen atom, a hydrocarbon group having 1 to 10 carbon atoms, a halogen atom, a halogen-substituted hydrocarbon group having 1 to 10 carbon atoms, —(CH$_2$)$_n$COOR$^1$, —(CH$_2$)$_n$OCOR$^1$, —(CH$_2$)$_n$OR$^1$, —(CH$_2$)$_n$CN, —(CH$_2$)$_n$CONR$^2$R$^3$, —(CH$_2$)$_n$COOZ, —(CH$_2$)$_n$OCOZ, —(CH$_2$)$_n$OZ, or —(CH$_2$)$_n$W, and B and C may bonded to each other to form

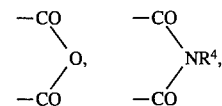

or a (poly)cycloalkylene group in which R$^1$, R$^2$, R$^3$, and R$^4$ may be the same or different and each represents a hydrocarbon group having 1 to 20 carbon atoms; Z represents a halogen-substituted hydrocarbon group having 1 to 20 carbon atoms; W represents a group SiR$^5_p$F$_{3-p}$ in which R$^5$ is a hydrocarbon group having 1 to 10 carbon atoms, F is a halogen atom, —OCOR$^6$, or —OR$^6$ (R$^6$ is a hydrocarbon group having 1 to 10 carbon atoms), p represents an integer of 0 to 3, and n represents an integer of 0 to 10.

3. The optical film according to claim 1, wherein said transparent film is obtained by molding a thermoplastic resin, which is a hydrogenated polymer obtained by the metathesis ring-opening polymerization of a tetracyclododecene derivative represented by the following formula (V),

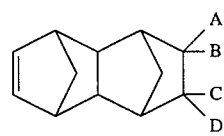
(V)

wherein A, B, C, and D may be the same or different and each represents a hydrogen atom, a hydrocarbon group having 1 to 10 carbon atoms, a halogen atom, a halogen-substituted hydrocarbon group having 1 to 10 carbon atoms, —$(CH_2)_nCOOR^1$, —$(CH_2)_nOCOR^1$, —$(CH_2)_nOR^1$, —$(CH_2)_nCN$, —$(CH_2)_nCONR^2R^3$, —$(CH_2)_nCOOZ$, —$(CH_2)_nOCOZ$, —$(CH_2)_nOZ$, or —$(CH_2)_nW$, and B and C may bonded to each other to form

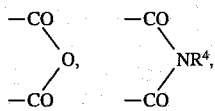

or a (poly)cycloalkylene group in which $R^1$, $R^2$, $R^3$, and $R^4$ may be the same or different and each represents a hydrocarbon group having 1 to 20 carbon atoms; Z represents a halogen-substituted hydrocarbon group having 1 to 20 carbon atoms; W represents a group $SiR^5_pF_{3-p}$ in which $R^5$ is a hydrocarbon group having 1 to 10 carbon atoms, F is a halogen atom, —$OCOR^6$ or —$OR^6$ ($R^6$ is a hydrocarbon group having 1 to 10 carbon atoms), p represents an integer of 0 to 3, and n represents an integer of 0 to 10.

4. The optical film according to claim 3, wherein at least one of A, B, C, or D is a polar group, which is a carboxylic acid ester group of the formula —$(CH_2)_nCOOR^1$, wherein $R^1$ is a hydrocarbon group having 1 to 20 carbon atoms and n is an integer of 0 to 10.

5. The optical film according to claim 3, wherein said tetracyclododecene derivative represented by the formula (V) have a methoxycarbonyl group or an ethoxycarbonyl group as a polar group.

6. The optical film according to claim 1, wherein the thickness of the transparent film is 0.005–2 mm.

7. The optical film according to claim 1, wherein the transparent film is prepared by a melt extrusion method or a solution casting method.

8. The optical film according to claim 1, wherein said photosensitive composition is a composition comprising at least one compound having at least one ethyleneic double bond and a photopolymerization initiator.

9. The optical film according to claim 1, wherein said photosensitive composition is a composition comprising at least one compound having at least one ring-opening reactive group and a photocationic reaction initiator.

10. The optical film according to claim 1, wherein said photosensitive composition is a composition comprising a gelatin and a bichromate.

11. The optical film according to claim 1, wherein said photosensitive composition is a composition comprising a novolak resin and a quinone azide photosensitizer.

12. The optical film according to claim 1, wherein said pattern is formed by a method comprising irradiating a photosensitive composition coated on the transparent film through a mask which is provided with a pattern in advance, and then developing the film.

13. The optical film according to claim 1, wherein said pattern is formed by a method comprising pressing a stamper which is provided with a pattern in advance onto the photosensitive composition coated on the transparent film and then irradiating and curing the photosensitive composition through the transparent film.

14. The optical film according to claim 1, wherein said pattern is formed by a method of directly irradiating the photosensitive composition coated on the transparent film with a laser beam, and then developing.

15. The optical film according to claim 1, wherein the retardation is 10 nm or less.

16. The optical film according to claim 1, wherein the deflection temperature under load is 120° C. or higher.

17. The optical film according to claim 1, wherein the transmittance in the visible light region of the transparent film is 90% or higher.

* * * * *